United States Patent
Huisman et al.

[11] Patent Number: 5,915,187
[45] Date of Patent: Jun. 22, 1999

[54] METHOD OF MANUFACTURING A SEMICONDUCTOR DEVICE WITH A PN JUNCTION PROVIDED THROUGH EPITAXY

[75] Inventors: Frederikus R. J. Huisman, Nijmegen; Wiebe B. De Boer, Eindhoven; Oscar J. A. Bulik, Eindhoven; Ronald Dekker, Eindhoven, all of Netherlands

[73] Assignee: U.S. Philips Corporation, New York, N.Y.

[21] Appl. No.: 08/768,482

[22] Filed: Dec. 18, 1996

[30] Foreign Application Priority Data

Dec. 21, 1995 [EP] European Pat. Off. ............. 95203593

[51] Int. Cl.[6] ................................................... H01L 21/20
[52] U.S. Cl. ...................... 438/379; 438/380; 438/505; 438/508
[58] Field of Search .................................. 438/379, 380, 438/478, 503, 505, 507, 508

[56] References Cited

U.S. PATENT DOCUMENTS

| | | |
|---|---|---|
| 3,487,272 | 12/1969 | Siebertz et al. . |
| 3,638,301 | 2/1972 | Matsuura ................................. 29/589 |
| 3,648,340 | 3/1972 | Maciver ................................... 29/589 |
| 4,062,103 | 12/1977 | Yamagishi ................................ 29/591 |
| 4,226,648 | 10/1980 | Goodwin et al. ....................... 148/175 |
| 4,541,000 | 9/1985 | Colquhoun et al. ..................... 357/15 |
| 5,316,958 | 5/1994 | Meyerson ................................. 437/31 |

FOREIGN PATENT DOCUMENTS 0421075  4/1991  European Pat. Off. .

Primary Examiner—Tuan H. Nguyen
Attorney, Agent, or Firm—Steven R. Biren

[57] ABSTRACT

The invention relates to a method of manufacturing a semiconductor device with a pn junction, whereby an epitaxial layer (2) with a first zone (3) of a first conductivity type and with a second zone (4) of a second conductivity type opposed to the first is provided on a silicon substrate (1), a pn junction (5) being formed between the second and first zones (3, 4, respectively). According to the invention, the method is characterized in that the epitaxial layer (2) is provided by means of a CVD process at a temperature below 800° C., the epitaxial layer (2) being provided in that first the first zone (3) and then the second zone (4) are epitaxially provided on the substrate (1), while no heat treatments at temperatures above 800° C. take place after the epitaxial layer (2) has been provided. The measure according to the invention renders it possible to achieve properties of semiconductor devices manufactured in accordance with the invention, for example the capacitance-voltage (CV) relation of varicap diodes, within wide limits according to specifications. In addition, semiconductor devices manufactured by the method according to the invention require no post-diffusion or measurement steps in order to bring the properties of the semiconductor device up to specifications.

4 Claims, 2 Drawing Sheets

METHOD OF MANUFACTURING A SEMICONDUCTOR DEVICE WITH A PN JUNCTION PROVIDED THROUGH EPITAXY

BACKGROUND OF THE INVENTION

The invention relates to a method of manufacturing a semiconductor device with a pn junction, whereby an epitaxial layer with a first zone of a first conductivity type and a second zone of a second conductivity type opposed to the first is provided on a silicon substrate, the pn junction being formed between said second and first zones.

A pn junction manufactured in this way is used in various types of semiconductor device. Thus the pn junction may be used, for example, for manufacturing a so-called varicap diode. The pn junction in such a diode is reverse biased during use by a reverse voltage across the pn junction. The region around the pn junction is depleted of charge carriers then and acts as a dielectric of a capacitance. The value of this capacitance depends on the reverse voltage and on the doping concentration of atoms of the respective conductivity type in the semiconductor material. The pn junction is accordingly used for obtaining a certain capacitance-voltage (CV) relation. It is alternatively possible, however, to influence the properties of other pn junctions, such as a base-emitter pn junction of a bipolar transistor, or the properties of a zener diode by means of the method.

U.S. Pat. No. 3,638,301 discloses a method of the kind mentioned in the opening paragraph whereby a varicap diode is manufactured. In this method, a $p^-$-type epitaxial layer is provided on the silicon substrate, whereupon dopant atoms are provided in the epitaxial layer through diffusions so as to form a first, $n^+$-type and a second, $p^+$-type zone.

The known method described has the disadvantage that it is not very flexible. The capacitance-voltage (CV) characteristics of varicap diodes manufactured by the known method can be varied to a very limited degree only. It is furthermore found to be necessary in practice to take a number of additional measures if very high uniformity requirements are to be met. Thus the diffusion for making the second zone is carried out for too short a period initially. Varicap diodes on a substrate are then tested and subsequently brought up to specification in one or several post-diffusion and measurement steps. Subsequently, all varicap diodes on the substrate are measured once more and the varicap diodes are selected for final mounting by an intricate calculation method, a so-called matching algorithm.

SUMMARY OF THE INVENTION

The invention has for its object inter alia to counteract said disadvantages by means of a method of manufacturing a pn junction whereby a wider variety of properties is possible, such as, for example, a specific capacitance-voltage relation of the reverse-biased pn junction, while at the same time the reproducibility of these properties is enhanced so that at least a number of additional measures such as post-diffusion and measurement steps can be omitted.

According to the invention, the method is for this purpose characterized in that the epitaxial layer is provided by means of a CVD process at a temperature lower than 800° C., the epitaxial layer being provided in that first the first zone and then the second zone are epitaxially provided on the substrate, while no heat treatments at a temperature higher than 800° C. take place after the epitaxial layer has been provided. The abbreviation CVD is here understood to mean Chemical Vapor Deposition, a process whereby a substance is provided in that process gases are dissociated in a reactor and the reaction products are caused to deposit as a solid substance on a surface of a substrate. The semiconductor material and the dopant atoms used for manufacturing a zone of a certain conductivity type are provided simultaneously from the gas phase in that case. According to the invention, therefore, the first and second zones are provided by means of a so-called low-temperature CVD process.

The measure according to the invention renders it possible to vary the doping profiles of the first and second zones, i.e. the gradient of the dopant atom concentration as a function of the depth below the surface, as desired in that the composition of the process gases is varied during deposition. Since no process steps at a temperature of more than 800° C. take place anymore after the epitaxial layer has been provided, there will be no or hardly any diffusion, and the doping concentration of the atoms of the conductivity type as a function of the depth below the surface, the doping profile, will remain as it was when provided during the CVD epitaxy. The doping profiles of the first and second zones determine the properties of the pn junction, for example how the capacitance of the reversebiased pn junction depends on the voltage across the pn junction.

The CV characteristic of the pn junction manufactured by the known method can be varied to a very limited degree only, because the dopant atoms of the first and second zones are provided by diffusion, and diffusion of dopant atoms proceeds along a fixed pattern. The method according to the invention on the other hand offers much wider possibilities for manufacturing a pn junction having properties as specified. Furthermore, pn junctions manufactured by the method according to the invention require no post-diffusion or measurement steps, and the good reproducibility of the doping profiles of the pn junction renders the selection of semiconductor devices simple. A matching algorithm may be redundant or becomes very simple.

Preferably, the epitaxial layer is provided by a CVD process at a temperature below 750° C., while no heat treatments at a temperature above 700° C. take place after the epitaxial layer has been provided. No disturbances in the doping profiles of the first and second zones take place during growing of the epitaxial layer when the latter is provided at such a low temperature.

The pn junction may be used in various ways in a semiconductor device. The pn junction may be insulated from further regions of the semiconductor device by means of ion implantation. Preferably, however, the epitaxial layer, once deposited, is provided with grooves which cut through the pn junction, whereby mesa structures with mutually insulated pn junctions are formed, whereupon the substrate and the epitaxial layer are subdivided into semiconductor devices each comprising a mesa structure. Such a mesa structure can be manufactured by etching at low temperature. In such a manner, for example, pn junctions forming part of a bipolar transistor or pn junctions forming varicap or zener diodes may be manufactured.

Preferably, after the grooves have been provided in the epitaxial layer, a surface of the grooves is given a passivating layer by means of an LPCVD process at a temperature below 700° C. The abbreviation LPCVD here stands for Low Pressure CVD process, i.e. a CVD process at a pressure below atmospheric pressure. It is found in practice that temperatures above approximately 700° C. may still cause some disturbance in the doping profiles during the application of a passivating layer. When the passivating layer is deposited at a temperature below 700° C., no disturbance of the doping profiles of the dopant atoms in the first and second zones takes place.

An additional advantage is obtained when the semiconductor device is manufactured with a varicap diode, dopant atoms being provided in the first zone adjacent the pn junction with a doping concentration below $10^{18}$ atoms/cm$^3$ and dopant atoms being provided in the second zone adjacent the pn junction with a doping concentration greater than or equal to $10^{19}$ atoms cm$^3$. Such a concentration of dopant atoms adjacent the pn junction leads to comparatively low field strengths adjacent the pn junction during use of the varicap diode, so that no problems arise involving leakage currents through the reverse biased pn junction. The comparatively high doping level of the second zone provides a low contact resistance to a metal layer used for contacting the diode, while also the internal resistance of the second zone is comparatively low.

BRIEF DESCRIPTION OF THE DRAWING

The invention will be explained in more detail below by way of example with reference to the drawings, in which.

The Figures are purely diagrammatic and not drawn to scale. Corresponding parts have been given the same reference numerals in general in the Figures.

DESCRIPTION OF THE PREFERRED EMBODIMENTS

In the embodiment, the pn junction manufactured by the method according to the invention is used for manufacturing a semiconductor device with a varicap diode.

The pn junction of the varicap diode is reverse biased during use by means of a reverse voltage across the pn junction. The region around the pn junction is depleted of charge carriers then and acts as a dielectric of a capacitance. The higher the reverse voltage, the larger the depleted region and the lower the capacitance. The varicap diode is often used as a variable capacitance in applications where an LC circuit (L=coil, C=capacitance) is tuned. The circuit may be tuned, for example, to a different frequency through a change in the capacitance C. Varicap diodes are widely used in, for example, tuning devices of radio and TV sets.

Figure 1:
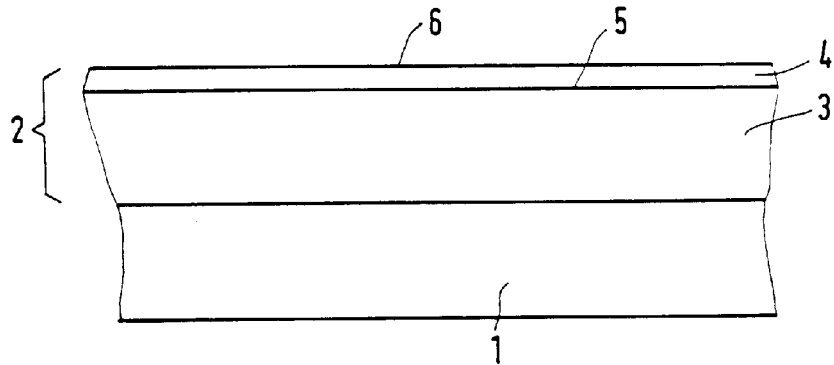
FIGS. 1, 3, 4 and 5 show various stages in the manufacture of a varicap diode according to the invention.

FIG. 1 shows a silicon substrate 1, in this example a low-ohmic Sb-doped n$^+$silicon wafer on which an epitaxial layer 2 is provided with a first zone 3 of a first conductivity type, in this example an n-type, and with a second zone 4 of a second conductivity type opposed to the first, in this example a p-type zone 4 adjoining a surface 6 of the epitaxial layer 2, a pn junction 5 being formed between the second zone 4 and the first zone 3. According to the invention, the epitaxial layer 2 is provided in a CVD process at a temperature below 800° C., the epitaxial layer being provided in that first the first zone 3 and then the second zone 4 are epitaxially provided on the substrate 1, while no heat treatments at a temperature above 800° C. take place after the epitaxial layer 2 has been provided. Preferably, the epitaxial layer 2 is provided in a CVD process at a temperature below 750° C., while no heat treatments at a temperature above 700° C. take place after the epitaxial layer 2 has been provided. When an epitaxial layer 2 is provided at such a temperature, no disturbances in the doping profiles of the first zone 3 and the second zone 4 take place during growing of the epitaxial layer 2. According to the invention, therefore, the first zone 3 and the second zone 4 are provided in a so-called low-temperature CVD process. The measure according to the invention renders it possible to provide the doping profiles of the first zone 3 and of the second zone 4, i.e. the dopant atom concentration gradient as a function of the depth below the surface 6, within wide limits as desired for specific applications. Since no process steps at a temperature above 800° C. take place after the provision of the epitaxial layer 2, there will be no or hardly any diffusion and the doping profile will remain as it was when provided during the CVD epitaxy.

The epitaxial layer 2 is provided in a so-called Epsilon reactor, make ASM, at a temperature of 700° C. and a pressure of $10^5$ N/m$^2$ (1 at). A mixture of SiH$_2$Cl$_2$ and PH$_3$ is dissociated for the n-type material of the first zone 3, and a mixture of SiH$_2$Cl$_2$ and B$_2$H$_6$ for the p-type material of the second zone 4. The ratio between SiH$_2$Cl$_2$ and PH$_3$ or the ratio between SiH$_2$Cl$_2$ and B$_2$H$_6$ is varied for manufacturing semiconductor material with a given doping profile. Since the doping profiles of the first zone 3 and the second zone 4 determine the CV characteristic of the varicap diode, it is much better possible by the method according to the invention to manufacture a varicap diode with a CV characteristic according to specifications.

Figure 2:
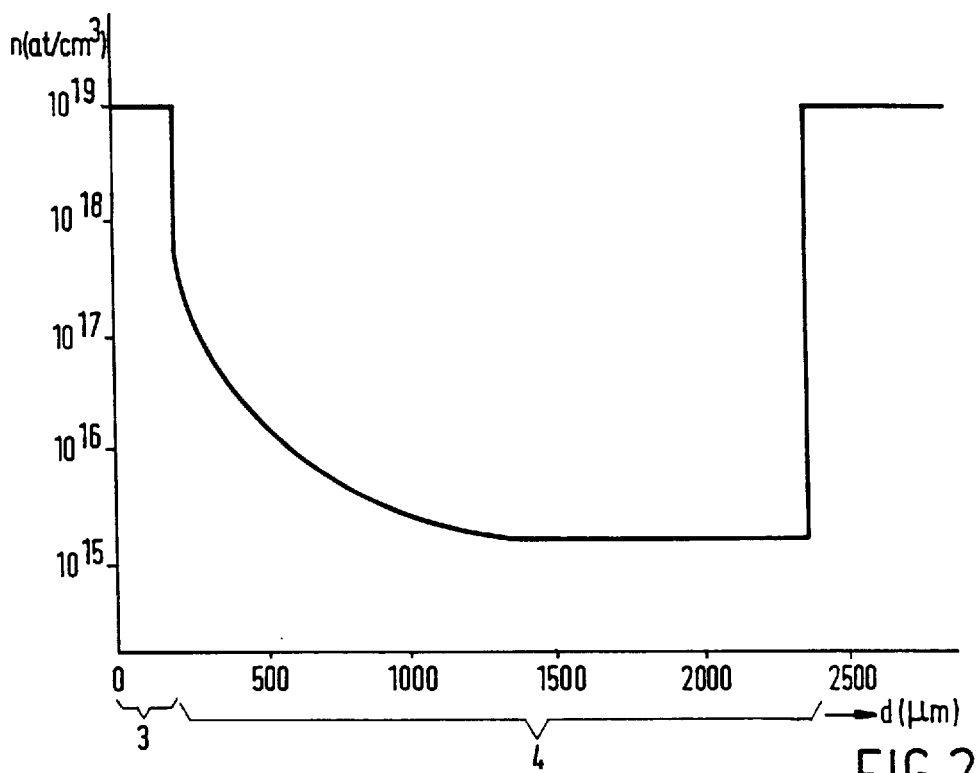
FIG. 2 shows a doping profile of a varicap diode manufactured in accordance with the invention.

FIG. 2 shows the doping profile in the epitaxial layer 2. The depth d below the surface 6 of the second zone is plotted on the horizontal axis and the concentration n of atoms of the conductivity type on the vertical axis. The dopant atoms in the first zone 3 adjacent the pn junction 5 are provided with a doping concentration below $10^{18}$ atoms/cm$^3$, in this example $4.5 \times 10^{17}$ atoms/cm$^3$, while dopant atoms are provided in the second zone adjacent the pn junction with a doping concentration greater than or equal to $10^{19}$ atoms/cm$^3$. Such a concentration of dopant atoms adjacent the pn junction 5 in practice leads to comparatively low field strengths adjacent the pn junction 5 during use of a varicap diode manufactured in accordance with the invention, so that no problems arise with leakage currents through the reverse biased pn junction 5.

Figure 3:
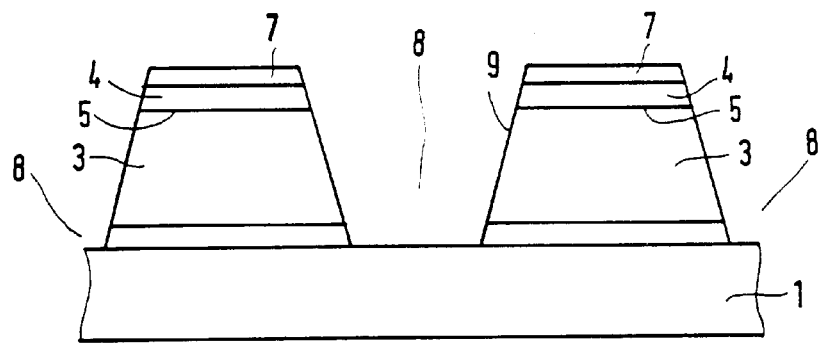

Subsequently, an etching mask 7 (FIG. 3) is provided on the surface 6 of the epitaxial layer 2. The surface is for this purpose provided with a silicon oxide layer by a standard technique such as, for example, PECVD (Plasma Enhanced CVD). This layer is subsequently patterned into an etching mask 7 by means of a standard lithographic and etching technique. The epitaxial layer is then provided with grooves 8 cutting through the pn junction 5 by means of an etching technique, in this example an etching step with KOH. The grooves 8 in this example continue into the substrate 1. Mesa structures are formed thereby with mutually insulated pn junctions 5, i.e. the pn junctions 5 are present in raised plateaus surrounded by the grooves 8. The etching mask 7 is subsequently removed in a standard oxide etching treatment.

Figure 4:
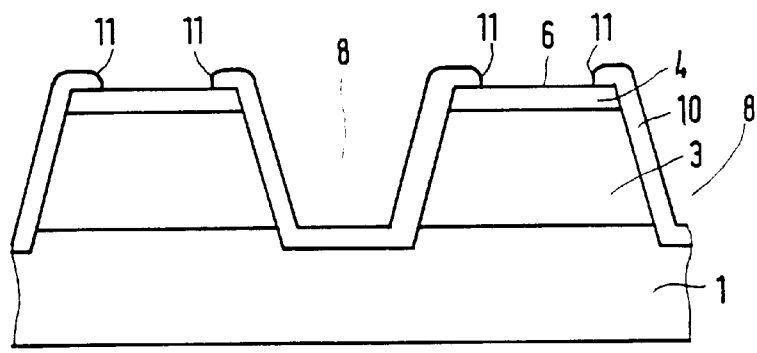

The pn junctions 5 come to the surface in the grooves 8. Therefore, the exposed surface 9 is given a passivating layer 10 (see FIG. 4) after the grooves 8 have been provided. The surface 9 is first treated with HNO$_3$ for forming a so-called native oxide. According to the invention, the passivating layer 10 is provided in an LPCVD process at a temperature below 700° C. In the present example, tetraethoxy silane (TEOS) is decomposed at a pressure of 30 N/m$^2$ and a temperature of 400° C., whereby a 1 μm thick silicon oxide layer is deposited on the surface 6 of the epitaxial layer 2 and on the exposed surface 9. No disturbance of the doping profiles of the dopant atoms in the first zone 3 and the second zone 4 takes place when the passivating layer 10 is deposited at a temperature below 700° C.

Figure 5:
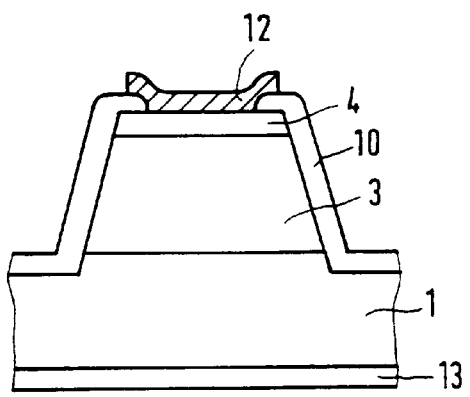

The passivating layer 10 is provided with contact holes 11 on upper sides 6 of the mesa structures by means of a standard lithography and etching process. Then a 0.5 μm thick aluminum layer 12 is deposited on the surface 6 and patterned by standard lithographic and etching techniques (see FIG. 5). This aluminum layer 12 serves to contact the second zone 4. To reduce the series resistance of the varicap diode, the substrate 1 is subjected to a grinding treatment whereby the thickness of the varicap diode is reduced to approximately 140 μm. A lower side of lower side of the substrate 1 is subsequently provided with a gold layer 13 for contacting the substrate 1.

Figure 6:
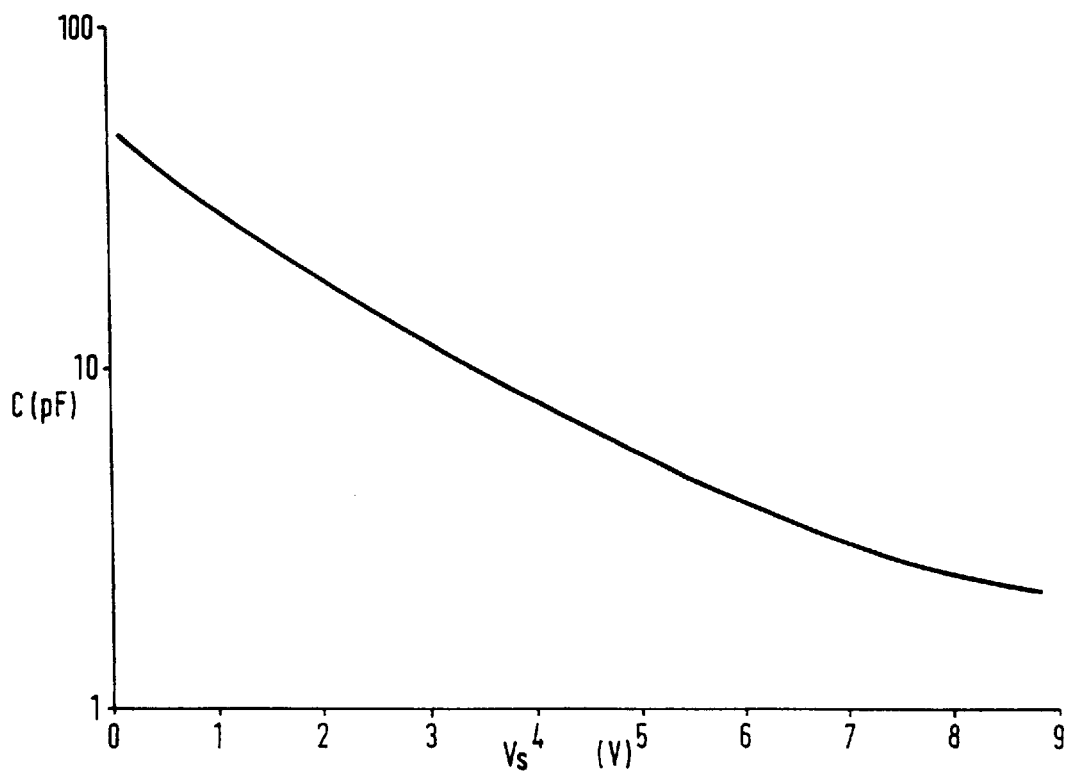
FIG. 6 shows a voltage-capacitance (CV) relation of a varicap diode according to the invention.

Then the structures thus created are subdivided into individual varicap diodes each comprising a mesa structure. The varicap diodes in this example have an active surface area of 190×190 μm. The varicap diodes are finally mounted in standard envelopes. FIG. 6 shows how the capacitance C of the reverse biased varicap diode varies as a function of the reverse voltage $V_S$ applied across the diode. A voltage sweep of approximately 8 V leads to a capacitance change of approximately 40 pF. Varicap diodes manufactured by a conventional technique require a voltage sweep of approximately 25 V for such a variation in capacitance. The varicap diode according to this embodiment is eminently suitable for use as a tuning diode for the VHF Mid Band (170–460 MHz), especially in portable, battery-operated units where a major capacitance change against a small voltage sweep is desired.

It is found in practice that, when a silicon wafer is provided with an epitaxial layer, the doping profiles across the wafer vary only very little, and in addition this variation is found to be very reproducible. Varicap diodes manufactured by the method according to the invention accordingly require no post-diffusion or measurement steps in practice. A matching algorithm may be very simple thanks to the reproducible results across the wafer.

The invention is not limited to the embodiment described above. Thus a varicap diode with a specific CV characteristic was manufactured in the embodiment. It will be obvious that varicap diodes with other CV characteristics may be manufactured through adaptation of the doping profiles of the first and second zones of the epitaxial layer. Other semiconductor devices may also be manufactured. Thus, for example, the pn junction may alternatively be used as a base-emitter junction in transistors, or as a zener or impatt diode. The properties of such transistors and diodes such as, for example, zener voltage, series resistance, breakdown voltage, and reverse-bias capacitance can be made according to specifications by the method according to the invention in that the doping profiles of the first and second zones are adapted. Thus it is possible to provide a thin layer of comparatively weakly doped semiconductor material of either conductivity type between the emitter and base zones in a base-emitter pn junction of a transistor. Such a base-emitter junction leads to a very fast transistor with low leakage currents. A pn junction manufactured in a similar manner may also be used as a so-called p-i-n junction in impatt diodes. It is also possible to influence the electric field distribution in a pn junction used as a base-collector junction in a transistor through the application of a special doping profile. Reference is made to S.M. Sze: "Physics of semiconductor devices", John Wiley & Sons, for the design and desired doping profiles of pn junctions in semiconductor devices.

Certain techniques for manufacturing the pn junction were mentioned above. This is not to say that the method according to the invention can be implemented by such techniques only. Thus, for example, the CVD process at comparatively high pressure used for providing the epitaxial layer may be replaced by a CVD process at a strongly reduced pressure, a so-called UHVCVD process. It is also possible to use a "Low Pressure" CVD process instead of a "Plasma Enhanced" CVD process.

More details and alternatives to known techniques can be found in handbooks such as S.M. Sze: "VLSI Technology", Mc-Graw-Hill Book Company and S. Wolf: "Silicon Processing for the VLSI Era", vols. 1, 2, Lattice Press.

We claim:

1. A method of manufacturing a varicap diode having a pn junction, which comprises:

providing a silicon substrate of a first conductivity type;

providing a first epitaxial layer of the first conductivity type on said substrate using a CVD process at a temperature lower than about 800° C.;

providing a second epitaxial layer of the second conductivity type opposite to that of said first conductivity type on said first epitaxial layer using a CVD process at a temperature lower than about 800° C., said first and second epitaxial layers forming an epitaxial layer comprising said pn junction;

providing grooves which cut through the pn junction, whereby mesa structures with mutually insulated pn junctions are formed; then further processing said diode, using heat treatments only at temperatures below about 800° C.; and then subdividing the substrate and the epitaxial layer into varicap diodes each comprising a mesa structure.

2. A method as claimed in claim 1, characterized in that the epitaxial layer is provided by a CVD process at a temperature below 750° C., while no heat treatments at a temperature above 700° C. take place after the epitaxial layer has been provided.

3. A method as claimed in claim 1, characterized in that, after the grooves have been provided in the epitaxial layer, a surface of the grooves is given a passivating layer by means of an LPCVD process at a temperature below 700° C.

4. A method as claimed in claim 1, characterized in that dopant atoms are provided in the first zone adjacent the pn junction with a doping concentration below $10^{18}$ atoms/cm$^3$ and dopant atoms are provided in the second zone adjacent the pn junction with a doping concentration greater than or equal to $10^{19}$ atoms cm$^3$.

* * * * *